(12) United States Patent
Fan et al.

(10) Patent No.: US 6,979,594 B1
(45) Date of Patent: Dec. 27, 2005

(54) PROCESS FOR MANUFACTURING BALL GRID ARRAY PACKAGE

(75) Inventors: Chun Ho Fan, New Territories (HK); Sadak Thamby Labeeb, New Territories (HK); Ming Wang Sze, New Terrirotires (HK)

(73) Assignee: ASAT Ltd., Hong Kong (HK)

( * ) Notice: Subject to any disclaimer, the term of this patent is extended or adjusted under 35 U.S.C. 154(b) by 123 days.

(21) Appl. No.: 10/323,657

(22) Filed: Dec. 20, 2002

Related U.S. Application Data (63) Continuation-in-part of application No. 10/197,832, filed on Jul. 19, 2002, now Pat. No. 6,800,948.

(51) Int. Cl.$^7$ .............................................. H01L 21/44
(52) U.S. Cl. ..................................... 438/113; 438/122
(58) Field of Search .................. 264/272.17; 438/113, 438/122, 124

(56) References Cited

U.S. PATENT DOCUMENTS

| | | | |
|---|---|---|---|
| 5,172,213 A | 12/1992 | Zimmerman | 257/796 |
| 5,311,060 A | 5/1994 | Rostoker et al. | 257/796 |
| 5,339,216 A | 8/1994 | Lin et al. | 361/707 |
| 5,444,025 A | 8/1995 | Sono et al. | |
| 5,493,153 A | 2/1996 | Arikawa et al. | 257/796 |
| 5,521,435 A | 5/1996 | Mizukoshi | |
| 5,609,889 A * | 3/1997 | Weber | 425/116 |
| 5,610,442 A | 3/1997 | Schneider et al. | 257/787 |
| 5,639,694 A | 6/1997 | Diffenderfer et al. | 437/209 |
| 5,650,663 A | 7/1997 | Parthasarathi | 257/706 |
| 5,672,548 A | 9/1997 | Culnane et al. | |
| 5,679,978 A | 10/1997 | Kawahara et al. | 257/697 |
| 5,705,851 A | 1/1998 | Mostafazadeh et al. | 257/675 |
| 5,736,785 A | 4/1998 | Chiang et al. | |
| 5,773,362 A | 6/1998 | Tonti et al. | |
| 5,877,552 A | 3/1999 | Chiang | |
| 5,909,057 A | 6/1999 | McCormick et al. | |
| 5,959,353 A | 9/1999 | Tomita | |
| 5,977,626 A | 11/1999 | Wang et al. | 257/707 |
| 5,986,885 A | 11/1999 | Wyland | 361/704 |
| 6,020,637 A | 2/2000 | Karnezos | |
| 6,037,658 A | 3/2000 | Brodsky et al. | |

(Continued)

FOREIGN PATENT DOCUMENTS

DE 100 15 962 10/2001

OTHER PUBLICATIONS

U.S. Appl. No. 10/647,696, Mohan Kirloskar et al., "Improved Ball Grid Array Package And Process for Manufacturing Same", filing date: Aug. 25, 2003.

(Continued)

*Primary Examiner*—David S. Blum
(74) *Attorney, Agent, or Firm*—Keating & Bennett, LLP (57) ABSTRACT

A ball grid array package is manufactured by mounting a semiconductor die to a first surface of a substrate array. Wires are bonded between the semiconductor die and ones of conductive traces of the substrate array. The heat spreader is disposed in a mold and the substrate array is releasably clamped to a top die of the mold. The semiconductor die, the substrate array, the wire bonds and the heat spreader are molded into a molding material to provide a molded package. Next, the molded package is removed from the mold and a plurality of solder balls are added in the form of a ball grid array on a second surface of the substrate array such that bumps of the ball grid array are electrically connected to the conductive traces. The integrated circuit package is then singulated from a remainder of the substrate array.

14 Claims, 12 Drawing Sheets

U.S. PATENT DOCUMENTS

| | | |
|---|---|---|
| 6,051,888 A | 4/2000 | Dahl |
| 6,104,093 A | 8/2000 | Caletka et al. |
| 6,122,171 A | 9/2000 | Akram et al. |
| 6,236,568 B1 | 5/2001 | Lai et al. .................... 361/704 |
| 6,251,706 B1 | 6/2001 | Paniccia .................... 438/122 |
| 6,313,521 B1 | 11/2001 | Baba |
| 6,323,066 B2 | 11/2001 | Lai et al. .................... 438/122 |
| 6,349,032 B1 | 2/2002 | Chan et al. |
| 6,414,385 B1 | 7/2002 | Huang et al. ............... 257/690 |
| 6,441,499 B1 | 8/2002 | Nagarajan et al. |
| 6,462,405 B1 | 10/2002 | Lai et al. .................... 257/675 |
| 6,469,381 B1 | 10/2002 | Houle et al. |
| 6,507,104 B2 | 1/2003 | Ho et al. |
| 6,525,421 B1 | 2/2003 | Chia et al. .................. 257/730 |
| 6,631,078 B2 | 10/2003 | Alcoe et al. |
| 6,656,770 B2 | 12/2003 | Atwood et al. |
| 2001/0015492 A1 | 8/2001 | Akram et al. ............... 257/706 |
| 2002/0005578 A1 | 1/2002 | Kodama et al. |
| 2002/0006718 A1 | 1/2002 | Distefano .................. 438/617 |
| 2002/0180035 A1 * | 12/2002 | Huang et al. ............... 257/706 |
| 2002/0185734 A1 | 12/2002 | Zhao et al. ................. 257/737 |
| 2003/0034569 A1 | 2/2003 | Caletka et al. .............. 257/796 |
| 2003/0075812 A1 | 4/2003 | Cheng et al. |
| 2003/0160309 A1 | 8/2003 | Punzalan et al. |
| 2003/0189245 A1 | 10/2003 | Fang |
| 2003/0226253 A1 | 12/2003 | Mayer |

OTHER PUBLICATIONS

U.S. Appl. No. 10/643,961, Chun Ho Fan et al., "Improved Ball Grid Array Package and Process for Manufacturing Same", filing date: Aug. 20, 2003.

U.S. Appl. No. 10/372,421, Joseph Andrew Martin et al., "Improved Ball Grid Array Package", filing date: Feb. 24, 2003.

U.S. Appl. No. 10/197,832, Joseph Andrew Martin et al., "Improved Ball Grid Array Package", filing date, Jul. 19, 2002.

U.S. Appl. No. 10/323,657, Chun Ho Fan et al., "Process for Manufacturing Ball Grid Array Package," filing date: Dec. 20, 2002.

* cited by examiner

PROCESS FOR MANUFACTURING BALL GRID ARRAY PACKAGE

CROSS REFERENCE TO RELATED APPLICATION

This is a continuation-in-part of U.S. patent application Ser. No. 10/197,832 entitled Improved Ball Grid Array Package, filed Jul. 19, 2002, now U.S. Pat. No. 6,800,948.

FIELD OF THE INVENTION

The present invention relates in general to integrated circuit packaging, and in particular to a unique method of manufacture of a ball grid array package with enhanced thermal characteristics.

BACKGROUND OF THE INVENTION

High performance integrated circuit (IC) packages are well known in the art. Improvements in IC packages are driven by industry demands for increased thermal and electrical performance and decreased size and cost of manufacture.

In general, array packaging such as Plastic Ball Grid Array (PBGA) packages provide a high density of interconnects relative to the surface area of the package. However, typical PBGA packages include a convoluted signal path, giving rise to high impedance and an inefficient thermal path which results in low thermal dissipation performance. With increasing package density, the spreading of heat generated by the package is increasingly important.

Figure 1:
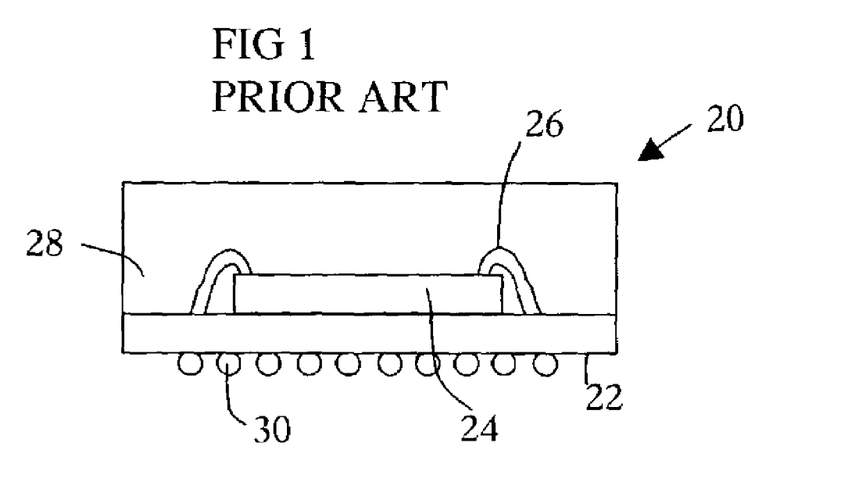
FIG. 1 shows an elevation view of a conventional plastic ball grid array package.

Reference is made to FIG. 1, which shows an elevation view of a conventional PBGA package indicated generally by the numeral 20. The PBGA package 20 includes a substrate 22 and a semiconductor die 24 attached to the substrate 22 by a die adhesive. Gold wire bonds 26 electrically connect the die 24 to metal traces on the substrate 22. The wire bonds and die 24 are encapsulated in a molding compound 28. Solder balls 30 are disposed on the bottom surface of the substrate 22 for signal transfer. Because of the absence of a thermal path away from the semiconductor die, thermal dissipation in this package is poor.

Variations to conventional BGA packages have been proposed for the purpose of increasing thermal and electrical performance. One particular variation includes the addition of a metal heat spreader to the package. In general, the metal heat spreader is fixed to the substrate after wire bonding and prior to molding. Each heat spreader is individually attached to a respective substrate. Next, the package is molded in a single cavity mold. Thus, additional process steps are required after production of a suitable heat spreader for this particular BGA package. These additional process steps include epoxy attaching individual heat spreaders, one at a time onto a respective substrate and curing the epoxy prior to molding.

It is therefore an object of an aspect of the present invention to provide a process for manufacturing a BGA package with a heat spreader that obviates or mitigates at least some of the disadvantages of the prior art.

SUMMARY OF THE INVENTION

A process for the manufacture of a ball grid array package is provided. The ball grid array package is manufactured by mounting a semiconductor die to a first surface of a substrate array. Wires are bonded between the semiconductor die and ones of conductive traces of the substrate array. The heat spreader is disposed in the mold cavity and then the substrate array is releasably clamped to a top side of a mold. The semiconductor die, the substrate array, the wire bonds and the heat spreader are molded in a molding material to provide a molded package. Next, the molded package is removed from the mold and a plurality of solder balls are added in the form of a ball grid array on a second surface of the substrate array such that bumps of the ball grid array are electrically connected to the conductive traces. The integrated circuit package is then singulated from a remainder of said substrate array.

In another aspect, there is provided a process for manufacturing a plurality of integrated circuit packages. The process includes mounting a plurality of semiconductor dice to a first surface of a substrate array. The semiconductor dice are bonded to ones of conductive traces of the substrate array. One of the substrate array and a heat spreader array is disposed in the mold cavity and the other of the substrate array and the heat spreader array is releasably clamped to a first side of a mold in a mold cavity. The semiconductor dice, the substrate array, the wire bonds and the heat spreader array are molded into a mold material to provide an array of molded packages. The array of molded packages is removed from the mold. A plurality of ball grid arrays is formed on a second surface of the substrate such that bumps of the ball grid array being electrically connected to the conductive traces. Each integrated circuit package is singulated from the array of molded packages.

Advantageously, a heat spreader is incorporated into the BGA package during molding. The heat spreader is prepared and placed in the mold and is incorporated into the package by molding. An array of heat spreaders is placed in the mold and molded with a substrate array such that a plurality of packages including heat spreaders are manufactured in a single mold shot.

In another aspect, a die adapter is included, the die adapter is mounted to the semiconductor die and contacts the upper surface of the heat spreader during molding to provide a package with a direct thermal path from the semiconductor die through the die adapter, to the heat spreader. The die adapter effectively pins the heat spreader against the lower mold surface during molding, thereby aiding in reducing mold flash on the outer side of the heat spreader.

BRIEF DESCRIPTION OF THE DRAWINGS

The invention will be better understood with reference to the following description and to the drawings, in which.

DETAILED DESCRIPTION OF THE PREFERRED EMBODIMENTS

Reference is now made to FIGS. 2A to 2H to describe a process for manufacturing a ball grid array package, according to an embodiment of the present invention. To simplify the description, the numerals used previously in describing FIG. 1 will be used again after raising the numerals by 100 where parts to be described correspond to parts already described.

The ball grid array package is indicated generally by the numeral 120 and is manufactured by mounting a semiconductor die 124 to a first surface of a substrate array 122. Wires 126 are bonded between the semiconductor die 124 and ones of conductive traces of the substrate array 122. The heat spreader 132 is disposed in a mold cavity and the substrate array 122 is releasably clamped to a topside of the mold. The semiconductor die 124, the substrate array 122, the wire bonds 126 and the heat spreader 132 are molded into a molding material to provide a molded package. Next, the molded package is removed from the mold and a plurality of solder balls 130 are added in the form of a ball grid array on a second surface of the substrate array 122 such that bumps of the ball grid array are electrically connected to the conductive traces. The integrated circuit package 120 is then singulated from a remainder of said substrate array 122.

Figure 2A:
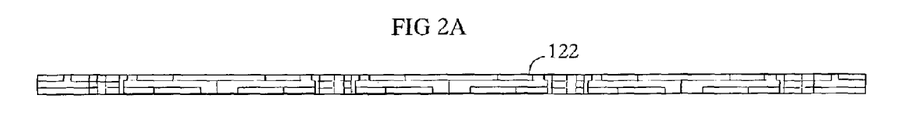
FIGS. 2A to 2H show the processing steps for manufacturing a ball grid array package, in accordance with one embodiment of the present invention.

The manufacture of the ball grid array integrated circuit package 120 will now be described in more detail with reference to FIGS. 2A to 2H. Referring first to FIG. 2A, the substrate 122 of a BT resin/glass epoxy printed circuit board with conductive traces for signal transfer is shown. A solder mask is disposed on the lower surface of the substrate 122, with portions of the conductive traces (interconnects) exposed. The substrate 122 is in the form of an array strip for producing a number of BGA units. Three such units are depicted in an array in FIG. 2A.

Figure 2B:
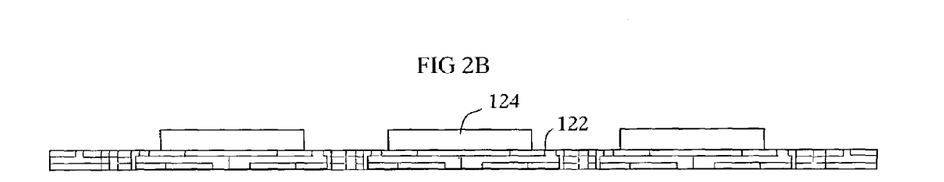
Figure 2C:
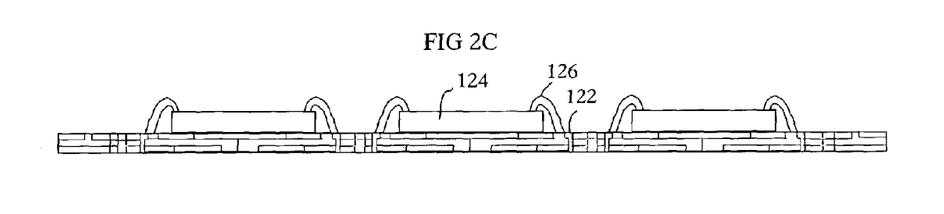

A singulated semiconductor die 124 is conventionally mounted to an upper surface of the substrate 122 using a suitable die attach adhesive (FIG. 2B). In the present embodiment, the semiconductor die 124 is attached using an epoxy and the epoxy is cured. The semiconductor die 124 has a conductive pad array formed thereon and wire bonds 126 are bonded between the conductive pads of the array and the conductive traces on the substrate 122 using conventional wire bonding techniques (FIG. 2C).

Figure 2D:
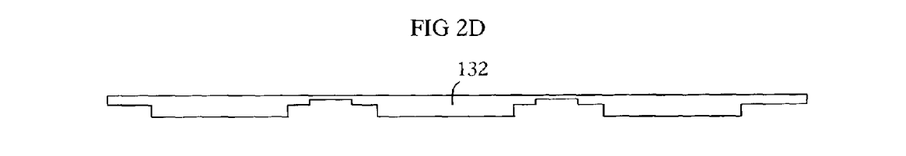

The heat spreader 132 is manufactured in the form of an array frame that is compatible with the substrate array 122 (FIG. 2D). In the present embodiment the heat spreader is a copper strip that is etched to form the array frame. The array frame includes a number of heat spreaders 132 joined together by partially-etched tie-bars. Three such heat spreaders are depicted in FIG. 2D.

Figure 2E:
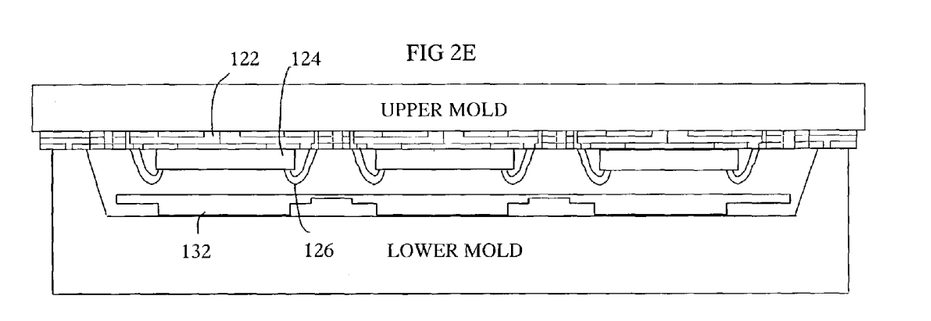
Figure 3:
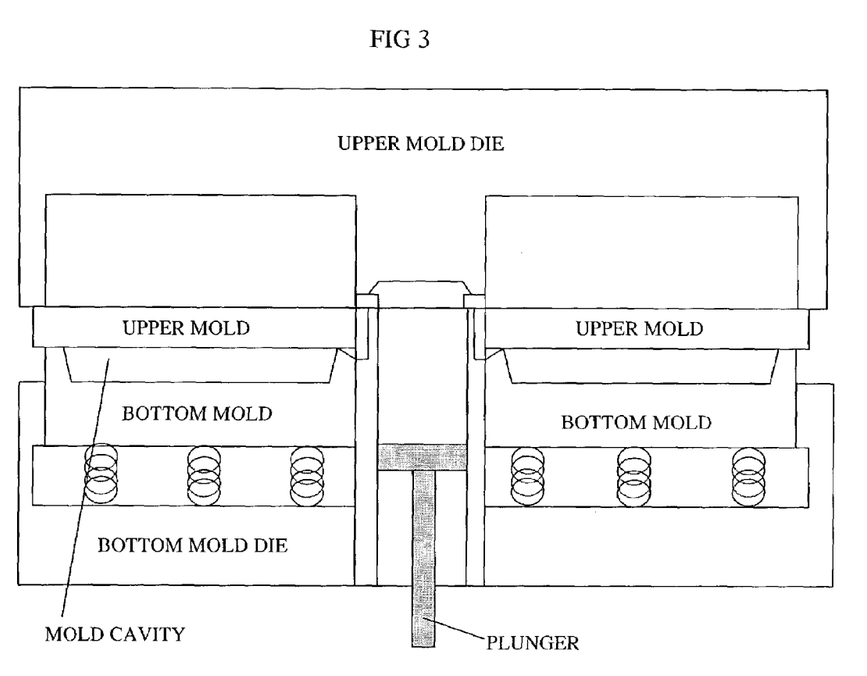
FIG. 3 shows a mold including upper and lower mold dies and a mold cavity therebetween, for encapsulating the ball grid array package, in accordance with the embodiment of FIGS. 2A to 2H.

The heat spreader 132, in the array format, is placed in the bottom of the die cavity, on the lower surface of the mold die, in the mold cavity. Features of the cavity and the frame are designed such that the heat spreader 132 aligns with the substrate 122 in the cavity (FIG. 2E). The substrate array strip 122 is then clamped to an upper surface of a mold die in a mold cavity such that the semiconductor die 124 protrudes from the substrate 22 into the mold cavity. Clamping of the substrate array strip 122 is achieved by closing the upper and lower mold dies, pinching the substrate array strip 122 in between. A suitable mold including the molding dies and mold cavity is shown in FIG. 3.

Figure 2F:
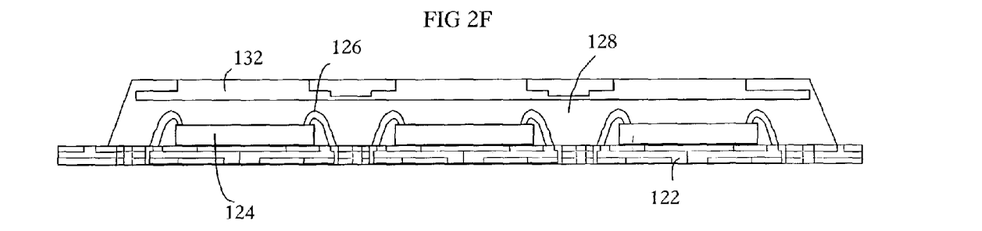

Next, the package 120 is encapsulated in a molding compound 128 in the mold cavity and the molded package 120 is removed from the mold. The molding compound 128 surrounds the wire bonds 126 and the semiconductor die 124 and joins the heat spreader 132 to the remainder of the package 120 (FIG. 2F).

Figure 2G:
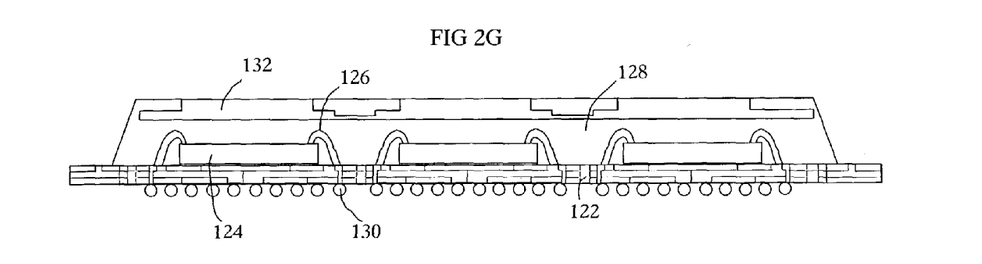

After removing the package 120 from the mold, the solder balls 130, also referred to as solder bumps, are formed on the lower surface of the substrate 122 by conventional positioning (FIG. 2G). To attach the solder balls 130, a flux is added to the balls prior to placement and, after placement, the solder balls 130 are reflowed using known reflow techniques. The solder balls are thereby connected to the conductive traces of the substrate 122 and through the wire bonds 126 to the semiconductor die 124. The solder balls 130 provide signal and power connections as well as ground connections for the semiconductor die 124.

Figure 2H:
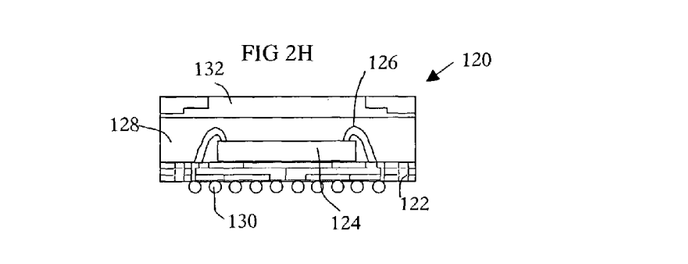

Singulation of the individual BGA unit from the strip array is then performed either by saw singulation or die punching, resulting in the configuration shown in FIG. 2H. Thus, the individual BGA package is isolated from the strip.

Figure 4A:
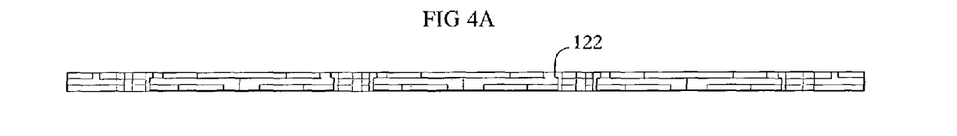
FIGS. 4A to 4I show the processing steps for manufacturing a ball grid array package, in accordance with another embodiment of the present invention.

Reference is now made to FIGS. 4A to 4I to describe the processing steps for manufacturing a ball grid array package, according to a second embodiment of the present invention. Referring to FIG. 4A, the substrate 122 of a BT resin/glass epoxy printed circuit board with conductive traces for signal transfer is shown. A solder mask is disposed on the lower surface of the substrate, with portions of the conductive traces (interconnects) exposed. The substrate 122 is in the form of an array strip for producing a number of BGA units. Three such units are depicted in an array in FIG. 4A.

Figure 4B:
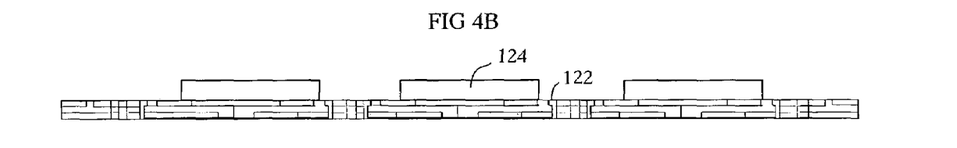

A singulated semiconductor die 124 is conventionally mounted to an upper surface of the substrate 122 using a suitable die attach adhesive (FIG. 4B). In the present embodiment, the semiconductor die is attached using an epoxy and the epoxy is cured. It now will be appreciated that FIGS. 3A and 3B are similar to FIGS. 2A and 2B.

Figure 4C:
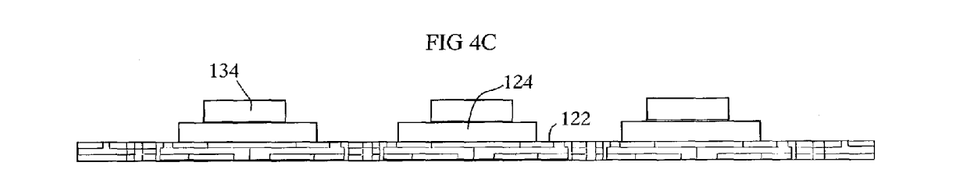

A die adapter 134 is mounted to the semiconductor die 124 using a thermally conductive adhesive for conducting heat from the semiconductor die 124 to the adapter 134 (FIG. 4C). In the present embodiment, the die adapter 134 is silicon.

Figure 4D:
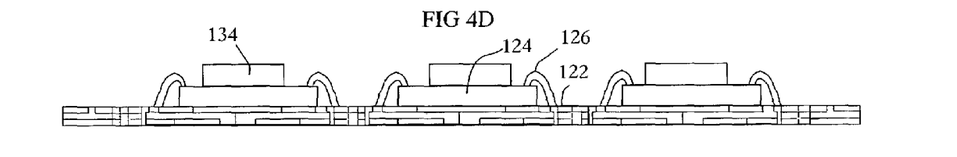

The semiconductor die has a conductive pad array formed thereon and wire bonds 126 are bonded between the conductive pads of the array and the conductive traces on the substrate 122 using conventional wire bonding techniques (FIG. 4D).

Figure 4E:
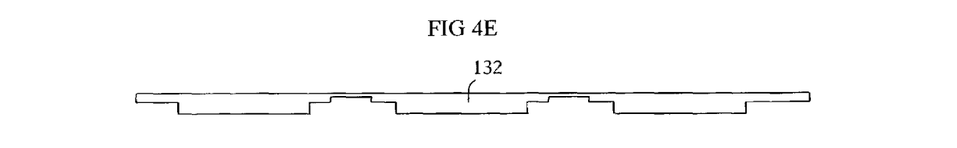

The heat spreader 132 is manufactured in the form of an array frame that is compatible with the substrate array 122 (FIG. 4E). In the present embodiment the heat spreader is a copper strip that is etched to form the array frame. The array frame includes a number of heat spreaders 132 joined together by partially-etched tie-bars. Three such heat spreaders are depicted in FIG. 4E.

Figure 4F:
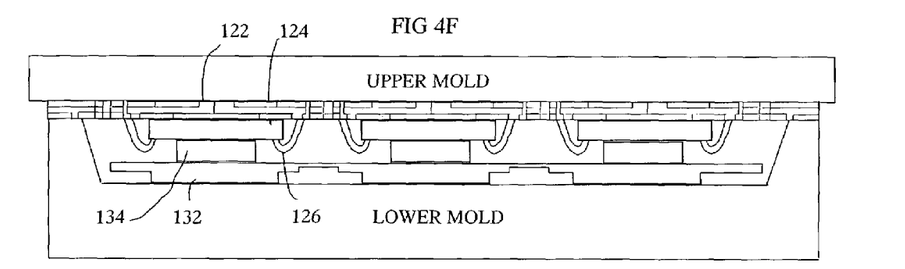

The heat spreader 132, in the array format, is placed in the bottom of the die cavity, on the lower surface of the lower mold die in the mold cavity. Features of the cavity and the frame are designed such that the heat spreader 132 aligns with the substrate 122, in the cavity. The substrate array strip 122 is then clamped to an upper surface of the upper mold die in the mold cavity such that the semiconductor die 124 and the die adapter 134 protrude downwardly from the substrate 22 into the mold cavity (FIG. 4F).

Figure 4G:
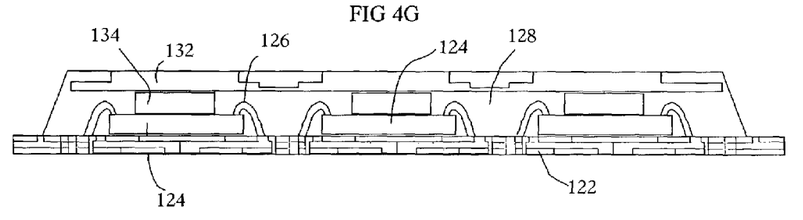

Next, the package 120 is encapsulated in a molding compound 28 in the mold cavity and the molded package 120 is removed from the mold. The molding compound 28 surrounds the wire bonds 126, the semiconductor die 124 and the die adapter 134 and joins the heat spreader 132 to the remainder of the package 120 (FIG. 4G). As shown in FIGS. 4F and 3G, the die adapter 134 contacts the upper surface of the heat spreader 132 during molding to provide a package with a direct thermal path from the semiconductor die 124 through the die adapter 134, to the heat spreader 132. The die adapter 134 effectively pins the heat spreader 132 against the lower mold die surface during molding, thereby aiding in reducing mold flash on the outer side of the heat spreader 132.

Figure 4H:
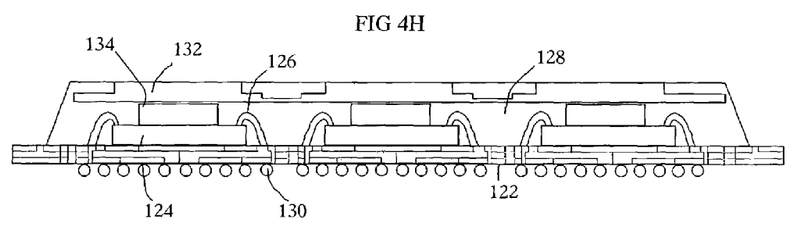

After removing the package 120 from the mold, the solder balls 130, also referred to as solder bumps, are formed on the lower surface of the substrate 122 by conventional positioning (FIG. 4H). To attach the solder balls 130, a flux is added to the balls prior to placement and, after placement, the solder balls 130 are reflowed using known reflow techniques. The solder balls are thereby connected to the conductive traces of the substrate 122 and through the wire bonds 126 to the semiconductor die 124. The solder balls 130 provide signal and power connections as well as ground connections for the semiconductor die 124.

Figure 4I:
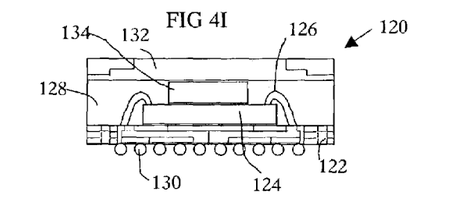

Singulation of the individual BGA unit from the strip array is then performed either by saw singulation or die punching, resulting in the configuration shown in FIG. 4I. Thus, the individual BGA package is isolated from the strip. manufacturing a ball grid array package, according to a second embodiment of the present invention. FIGS. 5A to 5D are similar to FIGS. 2A to 2D and therefore need not be further described herein.

Figure 5A:
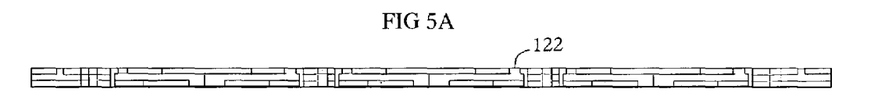
FIGS. 5A to 5I show the processing steps for manufacturing a ball grid array package, in accordance with still another embodiment of the present invention.
Figure 5B:
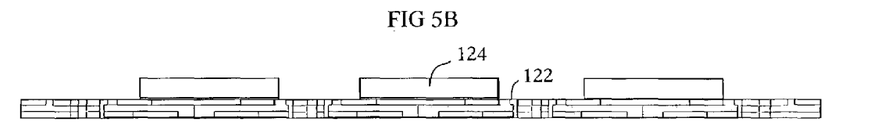
Figure 5C:
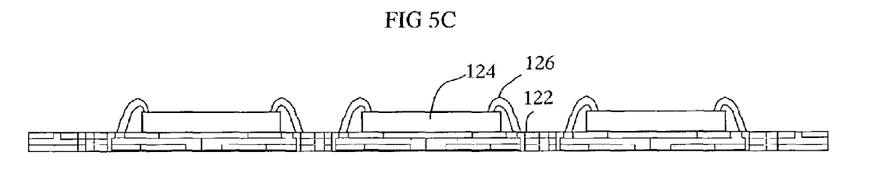
Figure 5D:
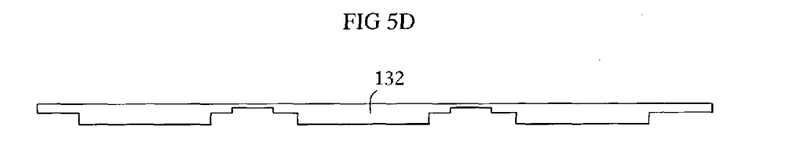
Figure 5E:
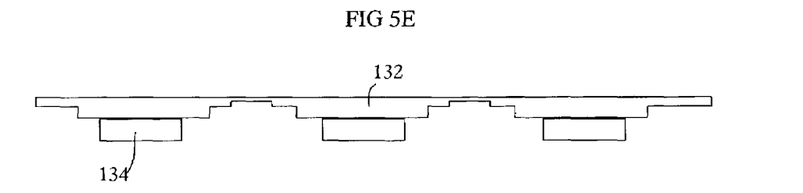

An adapter 134 is mounted to the heat spreader 132 using a thermally conductive adhesive for conducting heat from the adapter to the heat spreader 132 (FIG. 5E).

Figure 5F:
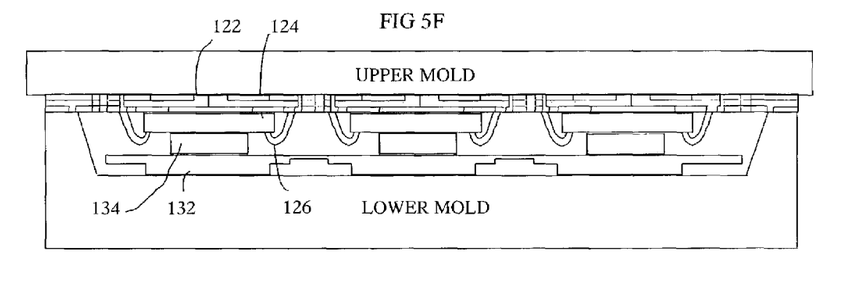

The substrate array strip 122 is clamped to an upper surface of a mold die in a mold cavity such that the semiconductor die 124 protrudes downwardly from the substrate 22 into the mold cavity. The heat spreader 132, in the array format, is placed in the bottom of the die cavity, on the lower surface of the mold die such that the adapter 134 protrudes upwardly into the mold cavity. Features of the cavity and the frame are designed such that the heat spreader 132 aligns with the substrate 122, in the cavity (FIG. 5F).

Figure 5G:
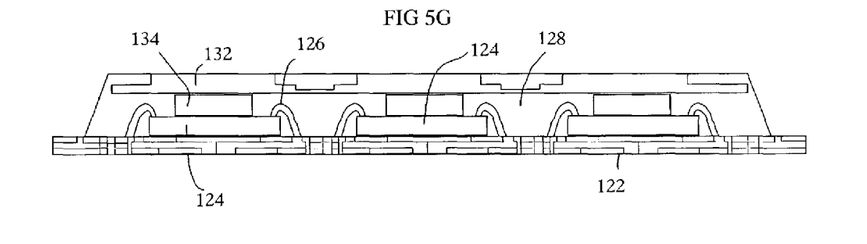

Next, the package 120 is encapsulated in a molding compound 28 in the mold cavity and the molded package 120 is removed from the mold. The molding compound 28 surrounds the wire bonds 126, the semiconductor die 124 and the die adapter 134 and joins the heat spreader 132 and adapter 134 to the remainder of the package 120 (FIG. 5G). As shown in FIGS. 3F and 3G, the die adapter 134 contacts the lower surface of the heat spreader 132 during molding to provide a package with a direct thermal path from the semiconductor die 124 through the die adapter 134, to the heat spreader 132. The die adapter 134 and heat spreader 132 are effectively pinned against the lower mold die surface during molding, thereby aiding in reducing mold flash on the outer side of the heat spreader 132.

Figure 5H:
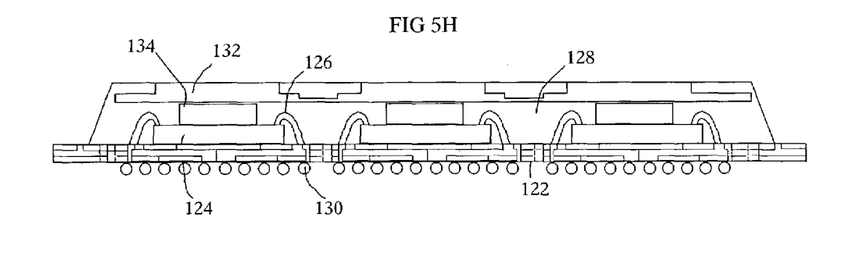
Figure 5I:
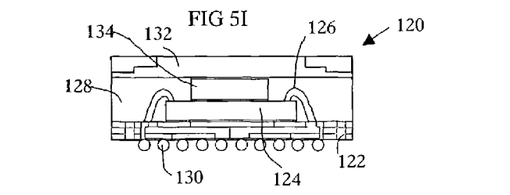

FIGS. 5H and 5I are similar to FIGS. 4H and 4I and therefore need not be further described herein.

Figure 6A:
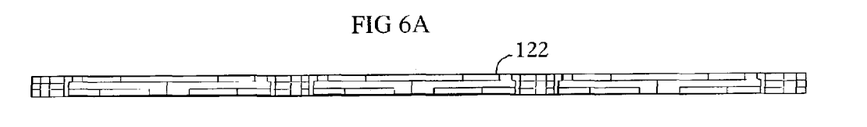
FIGS. 6A to 6H show the processing steps for manufacturing a ball grid array package, in accordance with yet another embodiment of the present invention.
Figure 6B:
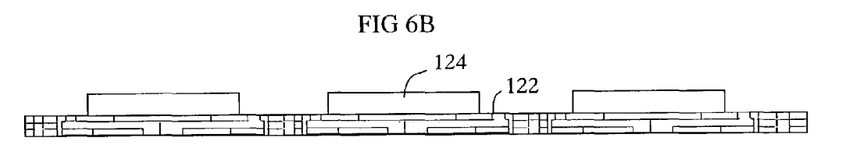
Figure 6C:
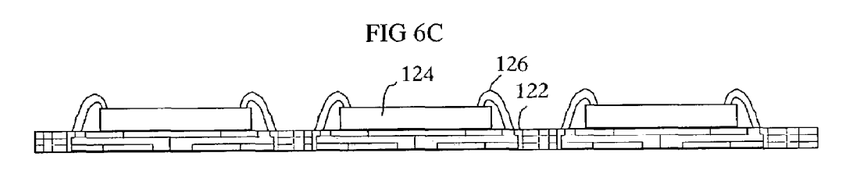
Figure 6D:
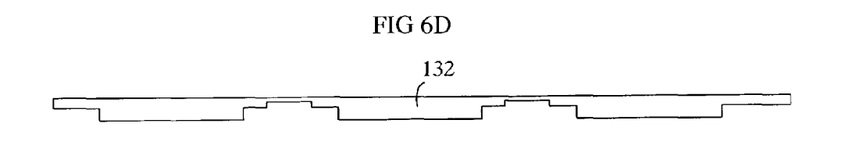
Figure 6E:
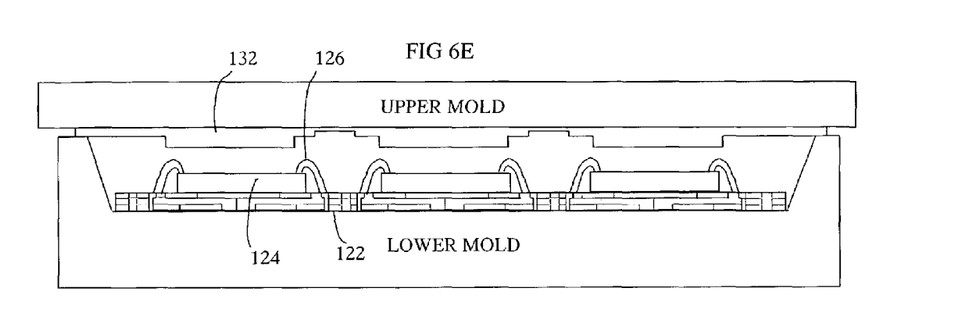
Figure 6F:
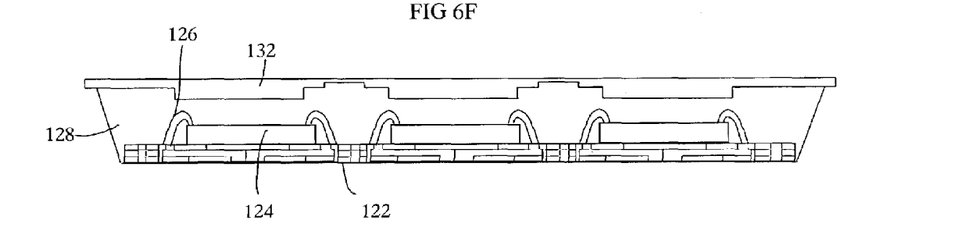
Figure 6G:
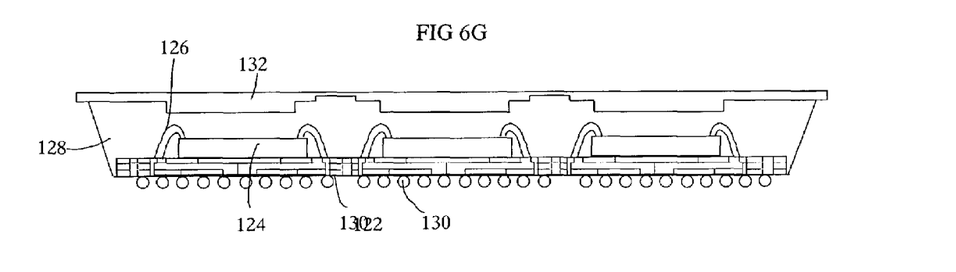
Figure 6H:
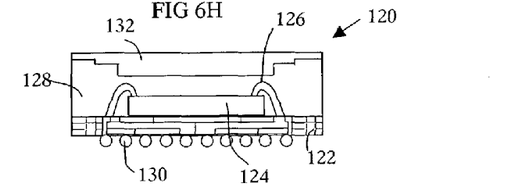

Alternative embodiments and variations are possible. For example, FIGS. 6A to 6H show an alternative embodiment of the present invention. FIGS. 6A to 6D are similar to FIGS. 2A to 2D and therefore need not be further described herein. Referring to FIG. 6E, rather than placing the heat spreader 132 in the bottom of the mold cavity and clamping the substrate 122 to the top mold die, the substrate 122 is placed in the bottom of the mold cavity and the heat spreader 132 is clamped to the top mold die. FIGS. 6F to 6H are similar to FIGS. 2F to 2H and are therefore not further described herein. It will now be appreciated that either one of the heat spreader and the substrate is placed in the bottom of the mold cavity and the other is clamped to the top mold die.

Figure 7A:
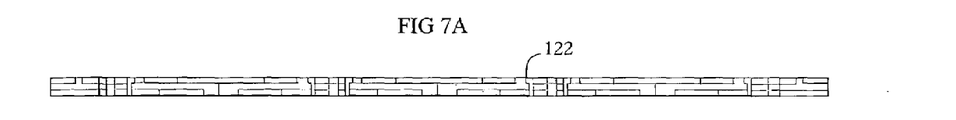
FIGS. 7A to 7I show the processing steps for manufacturing a ball grid array package, in accordance with yet another embodiment of the present invention.
Figure 7B:
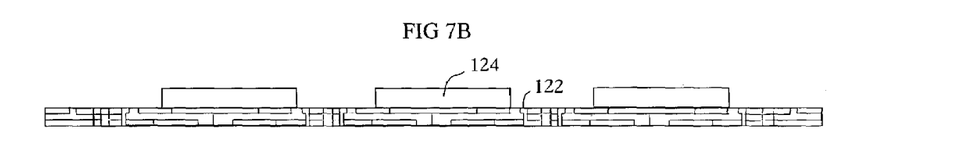
Figure 7C:
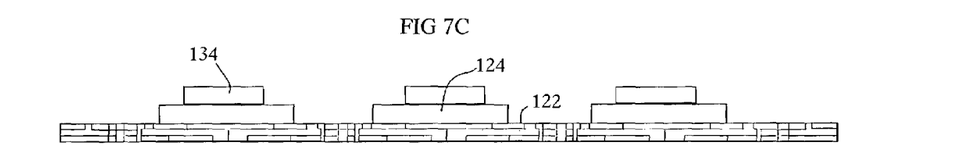
Figure 7D:
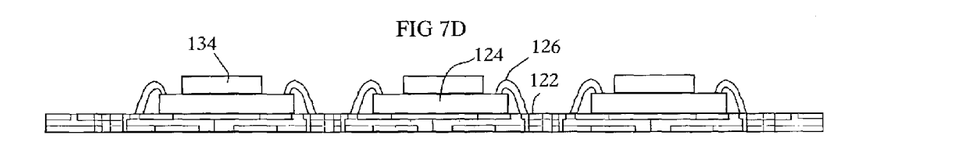
Figure 7E:
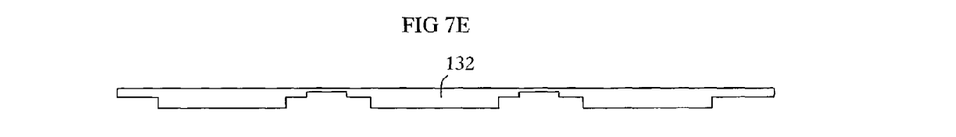
Figure 7F:
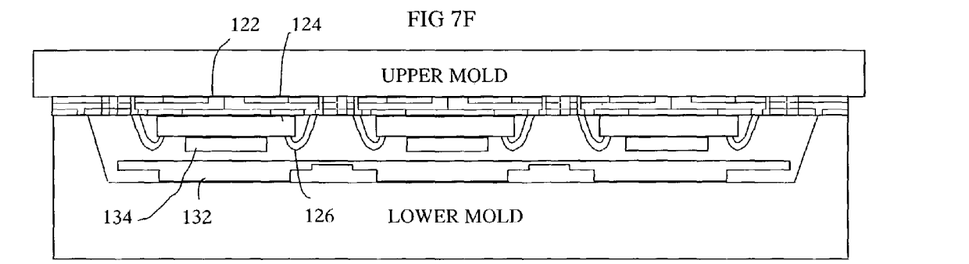
Figure 7G:
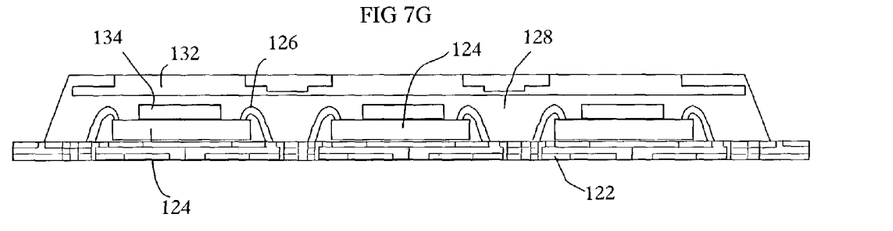
Figure 7H:
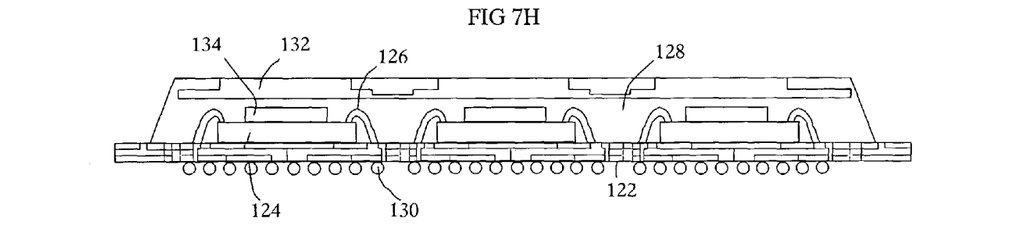
Figure 7I:
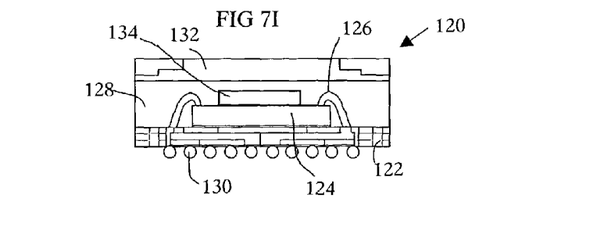

FIGS. 7A to 7I show the processing steps for manufacturing a ball grid array package, in accordance with yet another alternative embodiment. It will be appreciated that FIGS. 7A to 7I are similar to FIGS. 4A to 4I. In FIG. 7F, however, the die adapter 134 does not contact the heat spreader 132. Thus, there is a space between the die adapter 134 and the heat spreader 132, that is filled with molding compound during molding. The remainder of the manufacturing steps of the ball grid array package are similar to those shown in FIGS. 4A to 4I and are therefore not further described herein.

Other embodiments and variations are also possible. For example, rather than etching a copper strip to prepare the array frame of heat spreaders 132, the frame can be manufactured by metal stamping. Also, the heat spreader is not limited to copper as other suitable heat spreader materials are possible and will occur to those skilled in the art. The die adapter 124 is not limited to silicon as other suitable materials such as ceramics, metals, metal alloys and organic polymer materials can be used. It is also contemplated that a support structure can be added to inhibit the heat spreader array or the substrate array from bowing due to gravity during molding. Still other embodiments and variations may occur to those of skill in the art. All such embodiments and variations are believed to be within the scope and sphere of the present invention.

What is claimed is:

1. A process for manufacturing an integrated circuit package comprising:
   mounting a semiconductor die to a first surface of a substrate;
   wire bonding said semiconductor die to ones of conductive traces at said first surface of said substrate;
   disposing one of a heat spreader and said substrate on a surface of a lower mold die;
   releasably clamping edge portions of the other of said heat spreader and said substrate by pinching said edge portions between an upper mold die and said lower mold die at a periphery of a mold cavity between said upper mold die and said lower mold die, such that said other of said heat spreader and said substrate is in contact with said upper mold die;
   molding the semiconductor die, the substrate, the wire bonds and said heat spreader into a mold material by molding in said mold cavity, resulting in a molded package having at least a portion of said substrate exposed and at least a portion of said heat spreader exposed from said molded package prior to singulating;
   forming a ball grid array on a second surface of said substrate, bumps of said ball grid array being electrically connected to said conductive traces; and
   singulating said integrated circuit package.

2. The process for manufacturing an integrated circuit package according to claim 1, wherein said disposing comprises disposing said heat spreader in said mold cavity and said releasably clamping comprises releasably clamping said substrate to said upper mold die.

3. The process for manufacturing an integrated circuit package according to claim 1, wherein said disposing comprises disposing said substrate in said mold cavity and said releasably clamping comprises releasably clamping said heat spreader to said upper mold die.

4. The process for manufacturing an integrated circuit package according to claim 1, further comprising mounting a die adapter to said semiconductor die, prior to wire bonding said semiconductor die to ones of said conductive traces.

5. The process for manufacturing an integrated circuit package according to claim 4, wherein during said molding, said adapter contacts said heat spreader.

6. The process for manufacturing an integrated circuit package according to claim 2, further comprising mounting an adapter to said heat spreader prior to disposing said heat spreader in said mold cavity.

7. The process for manufacturing an integrated circuit package according to claim 6, wherein during said molding, said semiconductor die contacts said adapter.

8. A process for manufacturing a plurality of integrated circuit packages comprising:
    mounting a plurality of semiconductor dice to a first surface of a substrate array;
    wire bonding said semiconductor dice to ones of conductive traces at said first surface of said substrate array;
    disposing one of said substrate array and a heat spreader array on a surface of a lower mold die;
    releasably clamping edge portions of the other of said substrate array and said heat spreader array by pinching said edge portions between to an upper die of a mold and said lower mold die at a periphery of a mold cavity between said upper die and said lower mold die such that said other of the substrate array and said heat spreader array is in contact with said upper die of said mold;
    molding said semiconductor dice, said substrate array, said wire bonds and said heat spreader array into a mold material by molding in said mold cavity, resulting in an array of molded packages having at least a portion of said substrate array exposed and at least a portion of said heat spreader array exposed from said array of molded packages prior to singulating;
    forming a plurality of ball grid arrays on a second surface of said substrate array, bumps of said ball grid array being electrically connected to said conductive traces; and
    singulating each integrated circuit package from said array of molded packages.

9. The process for manufacturing a plurality of integrated circuit packages according to claim 8, wherein said disposing comprises placing said heat spreader array in said mold cavity such that said heat spreader array rests said lower mold die and said releasably clamping comprises releasably clamping said substrate array to said upper die of said mold.

10. The process for manufacturing a plurality of integrated circuit packages according to claim 9, further comprising mounting a plurality of die adapters to said semiconductor dice such that a die adapter is mounted to each semiconductor die, prior to wire bonding said semiconductor dice to ones of said conductive traces.

11. The process for manufacturing a plurality of integrated circuit packages according to claim 10, wherein during said molding, each of said adapters contacts a heat spreader of said heat spreader array.

12. The process for manufacturing a plurality of integrated circuit packages according to claim 9, further comprising mounting a plurality of adapters to said heat spreader array, such that a die adapter is mounted to each heat spreader of the heat spreader array, prior to disposing said heat spreader array in said mold cavity.

13. The process for manufacturing a plurality of integrated circuit packages according to claim 9, wherein during said molding, each of said semiconductor dice contacts one of said adapters.

14. The process for manufacturing a plurality of integrated circuit packages according to claim 8, wherein said disposing comprises placing said substrate array in said mold cavity such that said substrate array rests on said lower mold die and said releasably clamping comprises releasably clamping said heat spreader array to said upper die of said mold.

* * * * *